United States Patent [19]
Yonemizu et al.

[11] Patent Number: 5,985,039
[45] Date of Patent: Nov. 16, 1999

[54] APPARATUS AND METHOD FOR WASHING BOTH SURFACES OF A SUBSTRATE

[75] Inventors: Akira Yonemizu, Kumamoto; Yuji Matsuyama, Kumamoto-ken, both of Japan

[73] Assignee: Tokyo Electron Limited, Tokyo, Japan

[21] Appl. No.: 09/028,113

[22] Filed: Feb. 23, 1998

[30] Foreign Application Priority Data

Feb. 28, 1997 [JP] Japan ................................. 9-062209

[51] Int. Cl.⁶ ................................................. B08B 3/00
[52] U.S. Cl. .......................... 134/2; 134/1.3; 134/6; 134/18; 134/19; 134/25.4; 134/25.5; 134/26; 134/32; 134/902; 15/21.1; 15/77; 15/88.2; 15/88.3
[58] Field of Search ........................... 134/1.3, 2, 6, 18, 134/19, 25.4, 25.5, 26, 32, 902; 15/77, 88.2, 88.3, 21.1

[56] References Cited

U.S. PATENT DOCUMENTS

| | | | |
|---|---|---|---|
| 5,345,639 | 9/1994 | Tanoue et al. | 15/88.2 |
| 5,485,644 | 1/1996 | Shinbara et al. | 15/88.2 |
| 5,498,294 | 3/1996 | Matsushita et al. | 134/6 |
| 5,518,542 | 5/1996 | Matsukawa et al. | 15/77.2 |
| 5,651,160 | 7/1997 | Yonemizu et al. | 15/302 |
| 5,779,796 | 7/1998 | Tomoeda et al. | 134/902 |

*Primary Examiner*—Jill Warden
*Assistant Examiner*—S. Carrillo
*Attorney, Agent, or Firm*—Oblon, Spivak, McClelland, Maier & Neustadt, P.C.

[57] ABSTRACT

An apparatus and method for scrubbing both surfaces of a substrate which includes a process section having a first unit, a second unit, a main arm mechanism for transferring a substrate into/from the first and second units, a first cassette or a second cassette section for transferring plural cassettes, a first and second sub-arm for transferring a substrate into/from the cassette sections, and controllers, such that a first substrate taken out from the first cassette section is subjected to the first unit and then subjected to the second unit, while a second substrate taken out from the second cassette is subjected to the second unit and then subjected to the first unit.

16 Claims, 6 Drawing Sheets

APPARATUS AND METHOD FOR WASHING BOTH SURFACES OF A SUBSTRATE

BACKGROUND OF THE INVENTION

The present invention relates to an apparatus and a method for washing both surfaces of a substrate such as a semiconductor wafer and an LCD (liquid crystal device) substrate.

In the manufacturing step of a semiconductor device, a photolithographic technique is employed for forming a circuit, an electrode pattern etc. on the semiconductor wafer. In the photolithographic process, the semiconductor wafer is first coated with a photoresist solution. Then, the coated resist is exposed to light, followed by being developed with a developing solution. It should be noted that, before a series of resist processing noted above, a front surface of the wafer which is to be coated with a resist solution, is washed in order to prevent defect occurrence in the circuit pattern and short-circuiting of the wiring. It is also necessary to wash a back surface of the wafer in order to prevent a focus error during the light-exposure step and particle generation.

It was customary in the past to use a scrub-washing device for washing both surfaces of a semiconductor wafer with a brush, while supplying a washing liquid to the semiconductor wafer. In general, the washing device of this type includes a front surface washing unit, a back surface washing unit, a wafer reversion unit, and a heating/cooling unit, which are arranged with the transfer path sandwiched therebetween. Furthermore, the washing device has a wafer transfer arm mechanism moving on the transfer path. When the washing device is used for washing both surfaces of the semiconductor wafer, the wafer is transferred by a transfer mechanism into each of the units by the wafer transfer arm mechanism in accordance with a predetermined recipe, thereby applying a series of washing treatments to the wafer.

In the substrate washing treatment of this type, it takes long time to wash a substrate since both surfaces are washed separately. It follows that users desire to improve a throughput for the washing process.

In the conventionally-used process, a front surface of a wafer is first washed, heated, and cooled. The wafer is then reversed to wash the back surface thereof. The resultant wafer is reversed again and subjected to heating and cooling steps. Thus, the wafer is washed in the fixed manner mentioned above without flexibility. In these circumstances, users requires to wash a substrate in a more flexible manner. However, it is insufficient for the conventional both-surface washing apparatus to satisfy the aforementioned requirements.

BRIEF SUMMARY OF THE INVENTION

An object of the present invention is to provide an apparatus and a method for washing both surfaces of a substrate contributing to a high processing throughput and flexibility in the processing procedure.

To attain the aforementioned object, the following inventions [I] to [IV] are provided.

[I] An apparatus for washing both surfaces of a substrate comprises a process section having
a first washing unit for scrubbing a front surface of a substrate for a washing purpose by bringing a scrub member into contact with the front surface of the substrate while pouring a liquid to the front surface, and
a second washing unit for scrubbing a back surface of a substrate for a washing purpose by bringing a scrub member into contact with the back surface of the substrate while pouring a liquid to the back surface;

a main arm mechanism for loading/unloading a substrate into/from at least the first and second washing units included in the process section;

a first cassette section provided on one of sides of the process section for loading/unloading a plurality of cassettes housing substrates;

a second cassette section provided on the other side of the process section and facing the first cassette section with the process section interposed therebetween;

a first sub-arm mechanism for loading/unloading a substrate into/from a cassette in the first cassette section to pass the substrate between the first sub-arm mechanism and the main arm mechanism;

a second sub-arm mechanism for loading/unloading a substrate into/from a cassette in the second cassette section to pass the substrate between the second sub-arm mechanism and the main arm mechanism;

controllers for controlling the main arm mechanism and the process section, separately, such that a first substrate taken out from the first cassette is subjected to the first washing unit to wash its front surface, first, and then subjected to the second washing unit to wash its back surface; while a second substrate taken out from the second cassette is subjected to the second washing unit to wash its back surface first and then subjected to the first washing unit to wash its front surface.

[II] An apparatus for washing both surfaces of a substrate comprises:

a process section having
a first washing unit for scrubbing a front surface of a substrate for a washing purpose by bringing a scrub member into contact with the front surface of the substrate while pouring a liquid to the front surface, and
a second washing unit for scrubbing a back surface of a substrate for a washing purpose by bringing a scrub member into contact with the back surface of the substrate while pouring a liquid to the back surface;

a main arm mechanism for loading/unloading a substrate into/from at least the first and second washing units included in the process section;

a first cassette section provided on one of sides of the process section for loading/unloading a plurality of cassettes housing substrates;

a second cassette section provided on the other side of the process section and facing the first cassette section with the process section interposed therebetween;

a first sub-arm mechanism for loading/unloading a substrate into/from a cassette in the first cassette section to pass the substrate between the first sub-arm mechanism and the main arm mechanism;

a second sub-arm mechanism for loading/unloading a substrate into/from a cassette in the second cassette section to pass the substrate between the second sub-arm mechanism and the main arm mechanism;

controllers for controlling the first and second sub-arm mechanisms, the main arm mechanism, and the process section, separately, such that substrates are loaded into the process section successively from cassettes of the first and second cassette sections by means of first and second sub-arm mechanisms, and the substrates loaded in the process section are subjected to a scrub washing process by the main arm mechanism to wash simultaneously in different procedures.

[III] A method of washing both surfaces of a substrate, comprises the steps of:

(a) preparing a process section having a first washing unit for scrubbing a front surface of a substrate for a washing purpose by bringing a scrub member into contact with the front surface of the substrate while pouring a liquid to the front surface, and a second washing unit for scrubbing a back surface of a substrate for a washing purpose by bringing a scrub member into contact with the back surface of the substrate while pouring a liquid to the back surface;

a main arm mechanism for loading/unloading a substrate into/from at least the first and second washing units included in the process section;

a first cassette section provided on one of sides of the process section for loading/unloading a plurality of cassettes housing substrates;

a second cassette section provided on the other side of the process section and facing the first cassette section with the process section interposed therebetween;

a first sub-arm mechanism for loading/unloading a substrate into/from a cassette in the first cassette section to pass the substrate between the first sub-arm mechanism and the main arm mechanism;

a second sub-arm mechanism for loading/unloading a substrate into/from a cassette in the second cassette section to pass the substrate between the second sub-arm mechanism and the main arm mechanism;

controllers for controlling the main arm mechanism and the process section, separately, such that a first substrate taken out from the first cassette is subjected to the first washing unit to wash its front surface, first, and then subjected to the second washing unit to wash its back surface; while a second substrate taken out from the second cassette is subjected to the second washing unit to wash its back surface first and then subjected to the first washing unit to wash its front surface.

(b) washing a front surface of a first substrate taken out from the first cassette in the first washing unit, and then, subjecting the first substrate to the second washing unit to wash its back surface; and (c) washing a back surface of a second substrate taken out form the second cassette in the second washing unit, and then, subjecting the second substrate to the first washing unit to wash its front surface.

[IV] A method of washing both surfaces of a substrate, comprises the steps of:

(A) preparing a process section having a first washing unit for scrubbing a front surface of a substrate for a washing purpose by bringing a scrub member into contact with the front surface of the substrate while pouring a liquid to the front surface, and a second washing unit for scrubbing a back surface of a substrate for a washing purpose by bringing a scrub member into contact with the back surface of the substrate while pouring a liquid to the back surface;

a main arm mechanism for loading/unloading a substrate into/from at least the first and second washing units included in the process section;

a first cassette section provided on one of sides of the process section for loading/unloading a plurality of cassettes housing substrates;

a second cassette section provided on the other side of the process section and facing the first cassette section with the process section interposed therebetween;

a first sub-arm mechanism for loading/unloading a substrate into/from a cassette in the first cassette section to pass the substrate between the first sub-arm mechanism and the main arm mechanism;

a second sub-arm mechanism for loading/unloading a substrate into/from a cassette in the second cassette section to pass the substrate between the second sub-arm mechanism and the main arm mechanism;

controllers for controlling the first and second sub-arm mechanisms, the main arm mechanism, and the process section, separately.

(B) loading substrates successively by first and second sub-arm mechanisms from cassettes of the first and second cassette sections into the process section successively; and (C) scrubbing the substrates loaded into the process section for a washing purpose by using the main arm mechanism, simultaneously in different processing procedures.

In the inventions [I] and [III], first and second cassette sections are arranged with a process section interposed therebetween. A first substrate is taken out from the first cassette section to wash a front surface first and then subjected to a washing process for a back surface, while a second substrate is taken out from the second cassette section to wash a back surface thereof first and then subjected to a washing process for a front surface. In this way, a plurality of substrates can be treated simultaneously, with the result that the throughput of the processing can be improved.

In the inventions [II] and [IV], the first and second cassette sections are arranged with the process section interposed therebetween. A first substrate is taken out from the first cassette section and processed in accordance with recipe R1, while a second substrate is taken out from the second cassette section and processed in accordance with recipe R2 (different from recipe R2). In this way, a plurality of substrates can be processed simultaneously in different procedures (in accordance with its own flow chart), with the result that flexibility of the processing can be improved drastically.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, preferable embodiments of the present invention will be explained with reference to the accompanying drawings.

Figure 1:
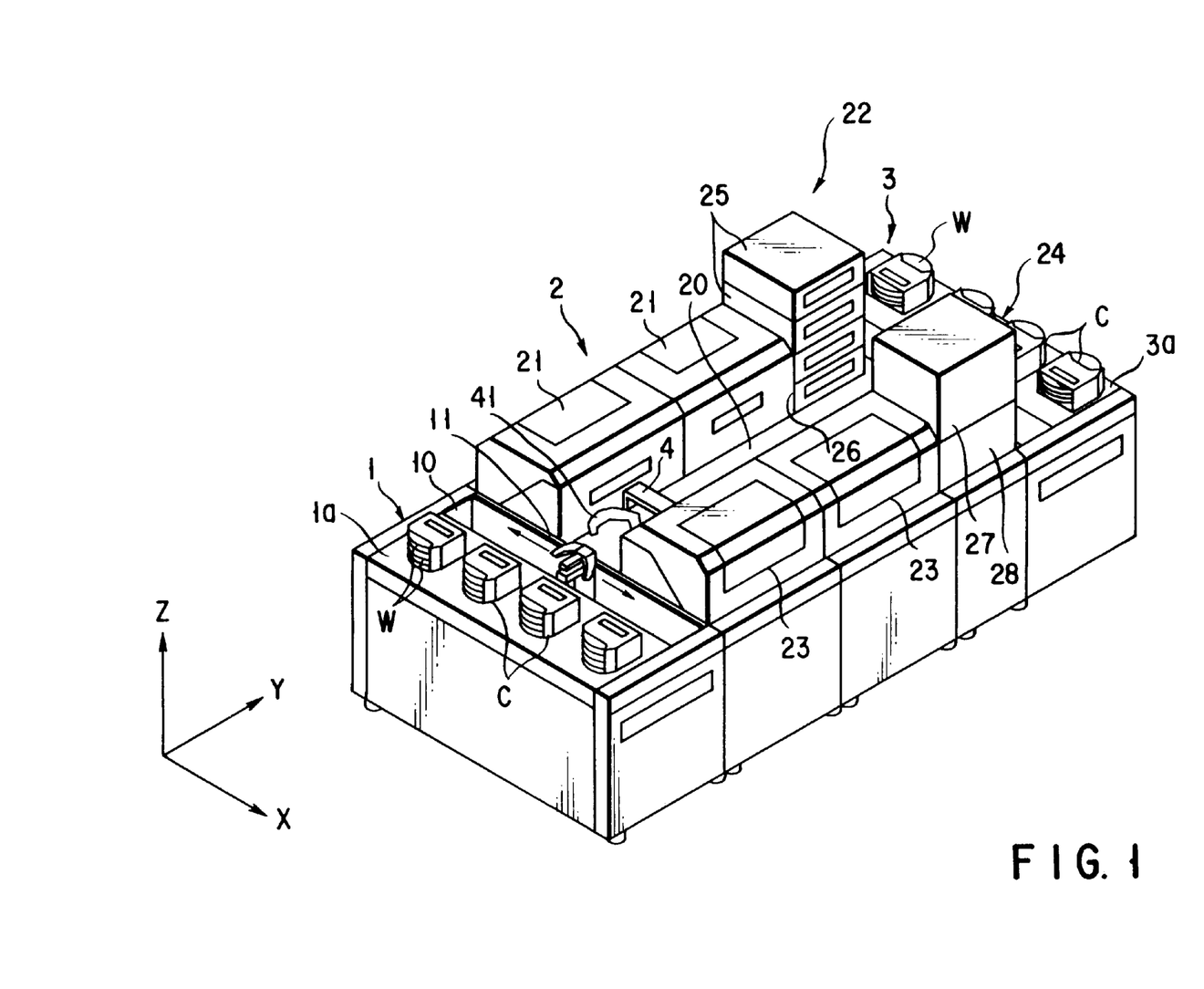
FIG. 1 is an oblique view showing an entire apparatus for washing both surfaces of a substrate.
Figure 2:
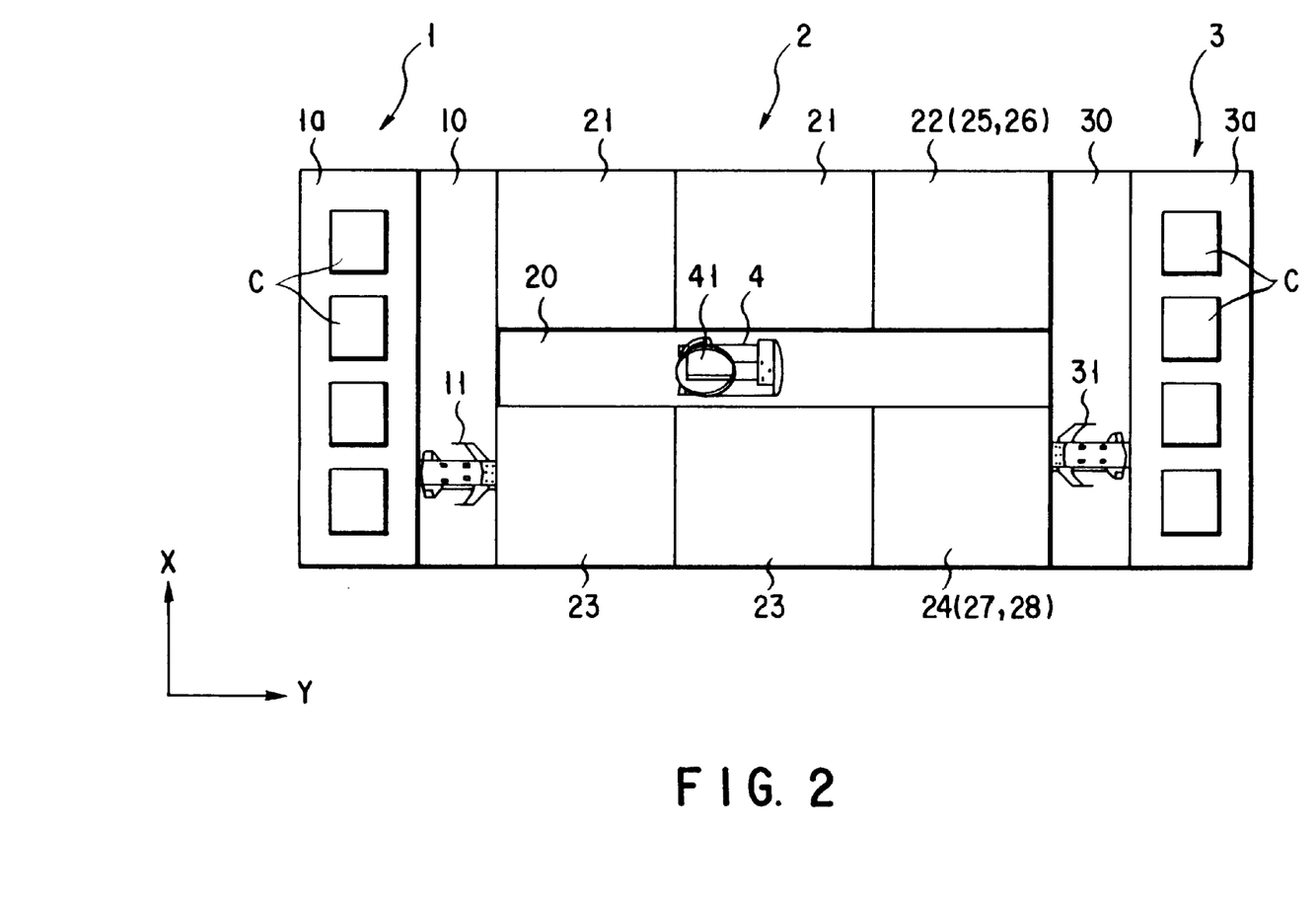
FIG. 2 is a plan view showing an entire apparatus for washing both surfaces of a substrate.

A substrate washing apparatus comprises first and second cassette stations 1 and 3, a process station 2, a main arm mechanism 4, first and second sub-arm mechanisms 11 and 31. A cassette table 1a extending in the X-axis direction is formed in a front portion of the first cassette station 1. A plurality of cassettes C are loaded on and unloaded from the cassette table 1a. A plurality of semiconductor wafers (e.g., 25 wafers) are horizontally arranged one upon the other within each cassette C.

The first sub-arm mechanism 11 is provided in a rear portion of the first cassette station 1. A sub-passageway 10 is formed in parallel to the cassette table 1a. The first sub-arm mechanism 11 moves in an X axis direction along the first sub-passageway 10. The first sub-arm mechanism 11 comprises a wafer holder section, a back-and-forth driving mechanism (not shown) for driving the wafer holder section back and forth within an XY plane, an X-axis driving (not shown) mechanism for moving the wafer holder section in the X-axis direction, a Z-axis driving mechanism (not shown) for moving the wafer holder section in a Z-axis direction, and a θ-rotation mechanism (not shown) for rotating the wafer holder section about the z-axis by an angle θ. A wafer W is taken out from the cassette C by the first sub-arm mechanism 11, and then passed to the main arm mechanism 4, and vice versa.

A main passageway 20 extending in a Y-axis is formed in a center portion of the process station 2. The main arm mechanism 4 is movably provided along the main passageway 20. The main passageway 20 crosses each of the first and second sub-passageways 10 and 30 to form a T-shape configuration. In other words, three passages 10, 20, and 30 form an H-configuration in the horizontal plane.

In the process station 2, a plurality of process units 21 to 28 are arranged so as to surround the main passageway 20. More specifically, two front surface washing units 21 and a thermal process unit group 22 are arranged side by side on one side of the main passageway 20. On the other hand, two back surface washing units 23 and a reversion unit group 24 are arranged side by side on the other side of the main passageway 20.

The thermal unit group 22 consists of four units 25 and 26 which are stacked one upon the other to form a vertically multiple-stage arrangement. The three heating units 25 for heating the wafer occupies three stages from the top. The lowermost stage is occupied by the cooling unit 26 for cooling the wafer.

Figure 7:
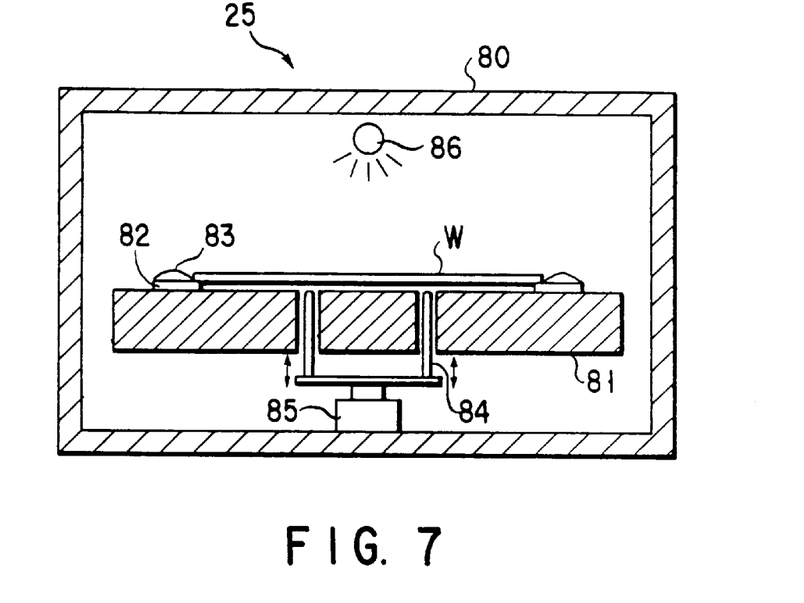
FIG. 7 is a perspective cross-sectional view of a heating unit of the substrate washing apparatus.

As shown in FIG. 7, the uppermost heating unit 25 has a lamp 86 emitting an ultraviolet ray onto the upper surface of the wafer W. The electric source for the lamp 86 is controlled by CPU 90 of the control section.

The reversion unit group 24 comprises a first and second units 27 and 28 stacked one upon the other. The first reversion unit 27 positioned in the upper stage has only a reverse mechanism (not shown) for reversing the wafer W. The second reversion unit 28 positioned in the lower stage has an alignment mechanism (not shown) for aligning the wafer W relative to the process unit other than a wafer reversion mechanism for reversing the wafer. These wafer reverse mechanism and the alignment mechanism are disclosed in U.S. Pat. No. 5,498,294.

The main arm mechanism 4 comprises a wafer holder section 41, a back-and-forth driving mechanism (not shown) for moving the wafer holder section 41 back and forth within an XY plane, a Y-axis driving mechanism (not shown) for moving the wafer holder section 41 in a Y-axis, a Z-axis driving mechanism (not shown) for moving the wafer holder section 41 in a Z-direction, and a θ rotation mechanism (not shown) for rotating the wafer holder section 41 about the z-axis by an angle θ. The main arm mechanism 4 loads/unloads the wafer W into and from each of process units 21 to 28 and passes the wafer W to/from the sub-arm mechanism 11 under the control of CPU 90 of the control section.

The second cassette station 3 is substantially the same as the first cassette station 1. Accordingly, the second sub-arm mechanism 31, which is substantially the same as the first sub-arm mechanism 11, is responsible for taking out the wafer w from the cassette C and passing it to/from the main arm mechanism 4.

Next, the front surface (upper surface) washing unit 21 and the back surface washing unit 23 will be explained with reference to FIGS. 3 and 4.

Each of the washing units 21 and 23 comprises a main body 41, a spin chuck 42, a washing section 43, a ultrasonic water supply mechanism 44, and a rinse liquid nozzle 45. The washing section 43 has scrubbing mechanisms 51 to 57 for scrub-washing the upper surface of the wafer W (a thermal oxidation film formed on the wafer W) supported by the spin chuck 42. A cup 46 is provided around the spin chuck 42 for preventing the washing liquid or the like to from being scattered to the outside.

Figure 5:
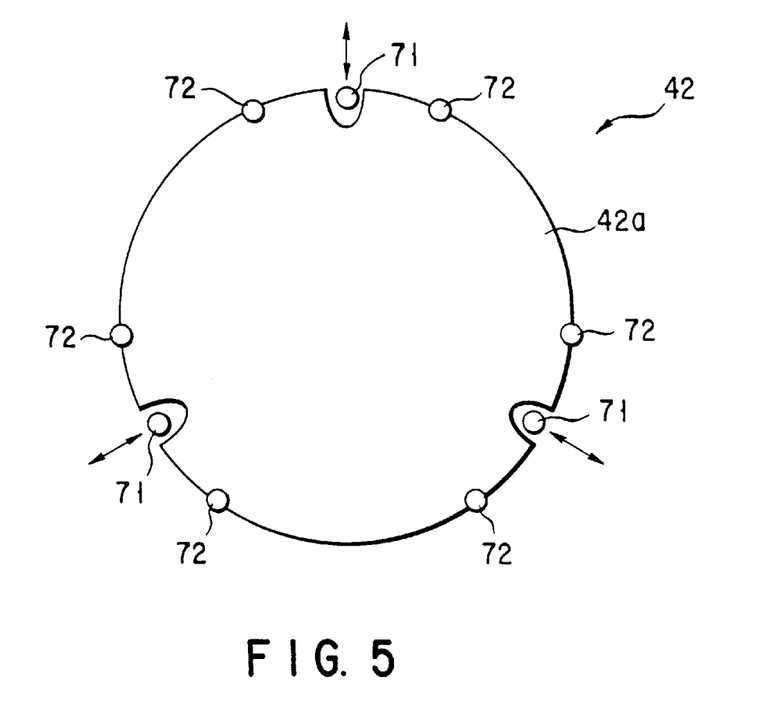
FIG. 5 is a plan view showing a spin chuck equipped with a mechanical holding mechanism (a mechanical chuck mechanism) for use in the washing unit.

The spin chuck 42 has a base plate 42a which is slightly larger in size than the wafer W. The base plate 42a has three movable pins 71 and six stationary pins 72 in the peripheral portion, as shown in FIG. 5. Each of the movable pins 71 is supported by a supporting axis 71a tiltably in the radius direction of the base plate 42a. The wafer W is mechanically held by the three movable pins 71 so as to prevent the wafer W from being moved on the base plate 42a.

Figure 6:
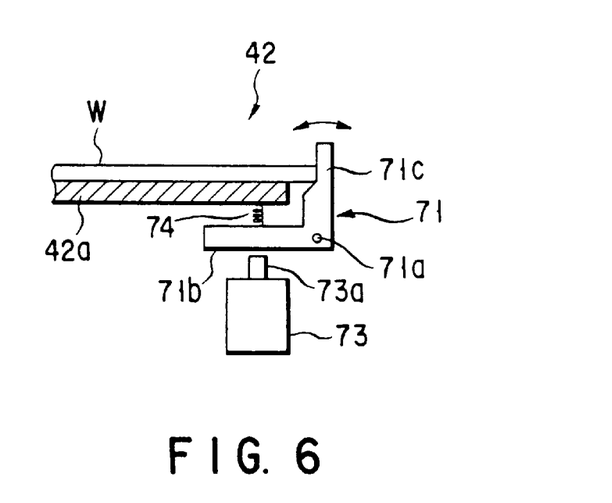
FIG. 6 is a side view showing a lock mechanism of the mechanical chuck mechanism.

As shown in FIG. 6, the movable pin 71 has an L shape configuration, as viewed from the sideward. The L shaped movable pin 71 is fixed on the supporting axis 71a at the bent portion. The horizontal portion 71b of the movable pin 71 is longer and heavier than the vertical portion 71c. A spring 74 is provided between the horizontal portion 71b of the movable pin 71 and the base plate 42a. A piston rod 73a of a cylinder 73 is provided immediately under the horizontal portion 71b of the movable pin 71.

Now, locking operation of the wafer W by the lock mechanism will be explained.

When the piston rod 73a is retreated into the cylinder 73, the movable pin 71 is inclined inward due to urging force of the spring 74. As a result, the vertical portion 71c of the pin touches the outer circumferential edge of the wafer W. In this way, the wafer is locked by the pin 71 to prevent the wafer W from being moved. When the wafer W is rotated together with the spin chuck, the movable pin 71 is inclined further inward by the centrifugal force. By this movement, the wafer W is firmly and securely locked.

On the other hand, when the piston rod 73a is allowed to project from the cylinder 73, the horizontal portion 71b is pushed upward by the rod 73a to allow the pin 71 to be inclined outward. In this way, the wafer W is unlocked. As mentioned in the foregoing, the locking mechanism for holding the wafer W mechanically permits the wafer W to be automatically aligned relative to the units 21 and 23. This makes it possible to omit an aligning step when the wafer W is reversed.

The holding means for the wafer W is not limited to the mechanical lock mechanism mentioned above. Other means such as a vacuum chuck mechanism may be used. When the vacuum chuck mechanism is used, the reversion unit 28 having an alignment mechanism must be used in the step of reversing wafer W.

Figure 3:
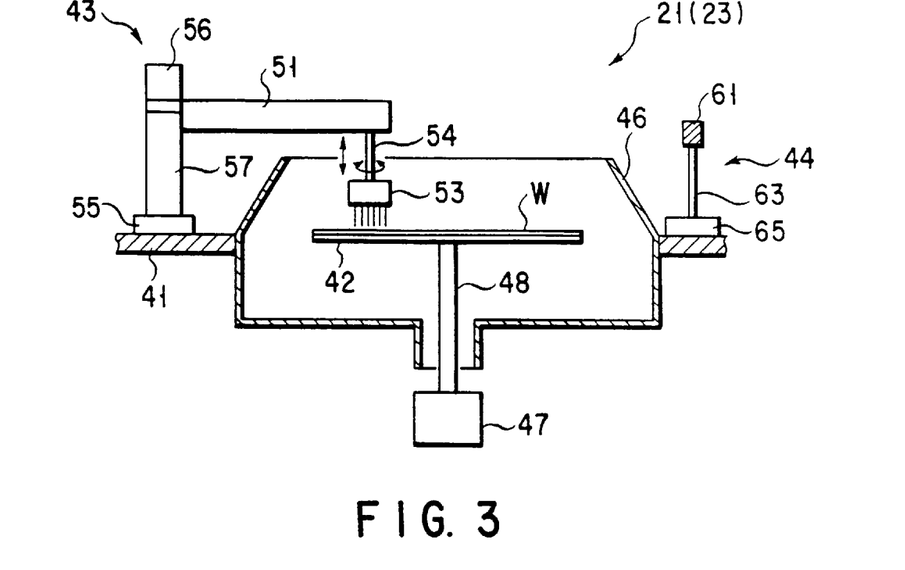
FIG. 3 is a perspective cross-sectional view showing a washing unit of the washing apparatus for both surfaces of a substrate according to the present invention.
Figure 4:
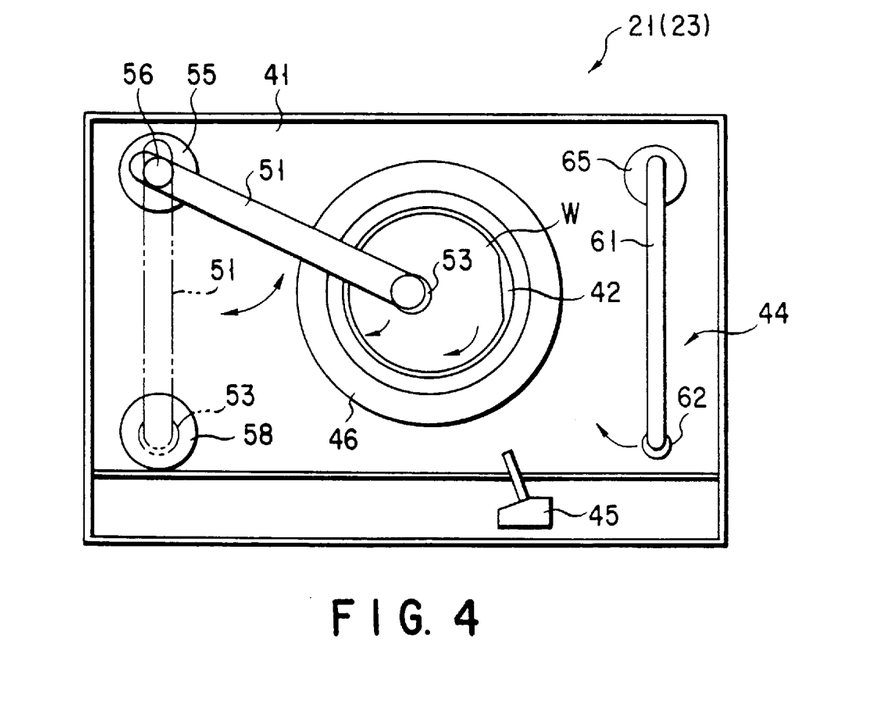
FIG. 4 is a plan view showing the washing unit of the washing apparatus according to the present invention.

As shown in FIGS. 3 and 4, the washing section 43 is arranged sideward of the spin chuck 42 in the base of the main body 41. The washing section 43 comprises a horizontal arm 51 rotatably provided on the supporting rod 57. Further, a brushing section 53 is provided on the tip portion of the horizontal arm 51 with a shaft 54 interposed therebetween. The supporting rod 57 is connected to the main body 41 and is supported by a support member 55. A stepping motor 56 is provided for rotating the brushing section 53 in the upper portion of the supporting rod 57. On the other hand, placed below the main body 41 are a stepping motor (not shown) for rotating the horizontal arm 51 and a cylinder (not shown) for moving the brush 53 up and down.

The horizontal arm 51 is swingable about the supporting member 55. The brushing section 53 is moved in a swinging manner from a home position indicated by an imaginary line (two dot-and-dash line) shown in FIG. 4 to the operation position immediately above the wafer center. A brush cleaning section 58 is formed in the home position. The brushing cleaning section 58 is responsible for removing foreign matter attached to the scrubbing portion of the brushing section 53, thereby cleaning the scrubbing portion. Note that it is desirable to use a brush made by bundling resin-fibers or sponge as the scrubbing portion of the brushing section 53. In particular, it is desirable to use a hard or soft sponge for forming the scrubbing portion of the brushing section 53 for washing the front surface of the wafer.

Now, a case in which both surfaces of the wafer W are washed will be explained. The brushing section 53 is allowed to be ascended away from the brushing cleaning section 58. Subsequently, the arm 51 is swung to move the brushing section 53 to the operating position immediately above the wafer center and then the brushing section 53 is descended. In this manner, the brushing section 53 abuts against the surface of the wafer W, as shown in FIG. 2. While this state is being maintained, the wafer W is rotated. Simultaneously, the brushing section 53 is rotated about its own axis while the brushing section 53 is allowed to move reciprocally between the central portion to the peripheral portion of the wafer W. During the period in which the scrubbing portion of the brushing section 53 is in contact with the surface of the wafer W, a washing liquid (e.g., pure water) is continuously supplied from a washing liquid supply source (not shown) to the scrubbing portion of the brushing section 53.

As shown in FIGS. 3 and 4, the ultrasonic water supply mechanism 44 is positioned on an opposite side of the driving mechanism of the brushing section 53 in the main body 41. To be more specific, the cup 46 is positioned at the center of the main body 41. The ultrasonic water supply mechanism 44 is arranged on one side of the cup, with the driving mechanism of the brushing section 53 being arranged on the other side. The ultrasonic water supply mechanism 44 has a horizontal arm 61 swingably provided on the supporting rod 63. Furthermore, a nozzle 62 is provided on the tip of the horizontal arm 61. The nozzle 62 is equipped with the ultrasonic wave generator (not shown). An ultrasonic wave having a predetermined frequency, which is generated form the ultrasonic wave generator, is applied to the water to be supplied to the wafer. It follows that the foreign matter is efficiently removed from the wafer surface by the excited water. Incidentally, the ultrasonic wave generator (not shown) may be provided on the wafer supply circuit extending from the nozzle 62 to the wafer supply source (not shown). Note that the supporting rod 63 is supported by the main body 41 via the supporting member 65. The horizontal arm 61 is moved in a swinging manner by the driving mechanism (not shown) from the home position (apart from the wafer W on the spin chuck) to the operation position (immediately above the wafer center on the spin chuck) indicated in FIG. 4. The washing liquid excited by the ultrasonic wave is spurted from the nozzle 62 toward the wafer W. Note that a washing mechanism using a high-pressure jet water may be used instead of the ultrasonic water supply mechanism 44.

The rinsing liquid nozzle 45 is provided outside the spin chuck 42, for supplying the rinsing liquid (e.g., pure water) onto the upper surface of the wafer W to wash out the residual matters from the wafer W after the washing step of the wafer W. It is possible to control the spurting direction of the rinsing liquid from the rinsing liquid nozzle 45.

In the washing units 21 and 23, the scrubbing portion of the brushing section 53 is moved along and in contact with the surface of the wafer W while the washing liquid is being supplied onto the wafer W on the spin chuck to scrub-wash the wafer surface. Alternatively, the wafer W is washed with the ultrasonic water which is supplied from the nozzle 62. After the washing, a rinsing liquid is supplied to the wafer W from the rinsing liquid nozzle 45 to wash out residual foreign matter from the wafer surface. Finally, the wafer W is rotated to centrifugally remove the liquid attached to the wafer surface to dry it.

Now, the heating unit 25 will be explained with reference to FIG. 7.

The heating unit 25 has a mechanism for heating to dry the wafer W from which the liquid attached to the wafer has been centrifugally separated by the spin-rotation. The heating unit 25 has a casing 80 housing a heating plate 81, which heats the wafer W to dry. The heating plate 81 is arranged to allow its surface to form a horizontal plane.

The heating plate 81 is equipped with a heater (not shown) whose electric power is controlled by CPU 90.

A plurality of spacers 82 are provided on the surface of the heating plate 81. The wafer W is held by the spacers 82. The wafer W is heated by heat radiation from the heating plate 81 without direct contact between the heating plate 81 and the wafer W. This heating system is called "proximity heating method". Consequently, the foreign matter attached to the heating plate 81 is not transferred onto the wafer W to prevent contamination of the wafer. A positioning member 83 is fixed with a screw to each of the spacers 82 to align the wafer W at a predetermined position. When the wafer W is transferred from the arm holder 41 onto the spacer 82 on the heating plate 81, the wafer W is gravitationally slid downward along the positioning member 83, with the result that the wafer W is settled at a position having a low energy potential.

Lift pins 84 are provided on the heating plate 81. The lift pins 84 are movable up and down by a driving mechanism 85. When the wafer W is loaded into, the lift pins 84 project to receive the wafer W. When the wafer W is unloaded, the wafer W is lifted by the lift pins. When the wafer W is heated to dry, the lift pins 84 are retreated into the heating plate 81.

The ultraviolet irradiation lamp 86 is provided in the heating unit 25 on the uppermost stage. More specifically, the ultraviolet irradiation lamp 86 is provided on the upper wall portion of the casing 80 so as to irradiate the wafer W from the above. Organic materials attached to the wafer surface are removed by the ultraviolet rays irradiated thereon. Note that if the front surface of the wafer W is irradiated while heating the back surface of the wafer W by the heat radiated from the heating plate 81, the organic materials can be removed more effectively from the front surface of the wafer W. The wafer W may be irradiated by the ultraviolet irradiation lamp 86 if necessary prior to the washing step with a washing liquid.

The cooling unit 26 is used for cooling the wafer W which has been heated in the heating unit 25. The wafer W is cooled by a "proximity cooling method" by mounting it on the cooling plate via spacers.

Figure 8:
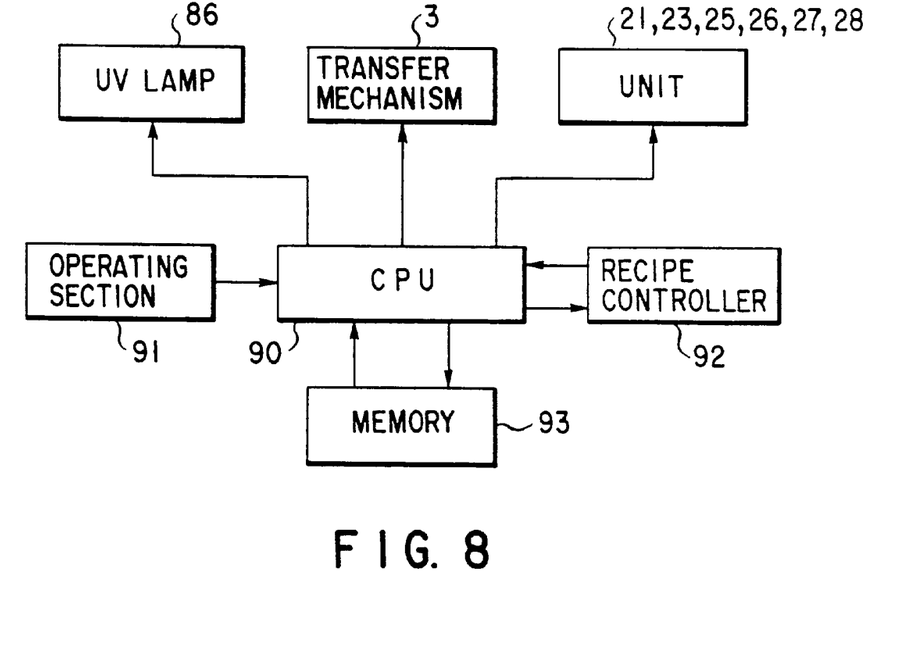
FIG. 8 is a block diagram showing a control section of the substrate washing apparatus.

Next, a control system of the apparatus will be explained with reference to FIG. 8.

In the washing apparatus for both surfaces, a series of processing operations is controlled by the CPU 90 in accordance with a predetermined recipe. A memory 93 is connected to the CPU 90. The recipe corresponding to various washing sequences (described later) is stored in the memory 93. In an operation section 91, when an operator selects a desired sequence to transmit the signal to the CPU 90, a recipe controller 92 selects a desired recipe. The CPU controls individual units 21 to 28 and individual transfer mechanisms and the power of the ultraviolet lamp 86, separately. Note that the control system of the apparatus may consist of a host computer (not shown) for collectively controlling the entire system and a plurality of block computers (not shown) for controlling the driving sections of individual process units 21 to 28, separately.

In the apparatus of washing both surfaces, thus constructed, a first sub-arm mechanism 11 first gains access to a cassette 1 housing unprocessed wafers W. single wafer is taken out from the cassette 1 mounted on the cassette station 1, centered, and passed from the first cassette station arm 11 to the holder 41 of the main arm mechanism 4 included in the process station 2.

Thereafter, the wafer W is loaded into a predetermined unit in accordance with a predetermined recipe and then transferred to each unit based on the recipe noted above. In this way, a series of processes is completed.

In this embodiment, the basic recipe includes the steps of washing the front surface of the wafer W in the front surface washing unit 21; reversing the wafer in the reversion unit 27 or 28; washing the back surface of the wafer W in the back surface washing unit 23, and reversing again the wafer W in the first reversion unit 27 or the second reversion unit 28. Further, additional steps such as a heat-dry step of the wafer W after each of the washing steps, and an ultraviolet irradiation step prior to the front surface washing, performed in the front surface washing unit 21, are selectively incorporated into the basic recipe of the operation by the operating section 91. A desired recipe is chosen by the recipe controller 92 in correspondence with a desired operation thus selectively set. CPU 90 controls individual units, the transfer mechanism, and the ultraviolet lamp, in accordance with the selected recipe. More specifically, the recipe controller 92 selects one of six recipes R1 to R6 shown in FIG. 9.

Figure 9:
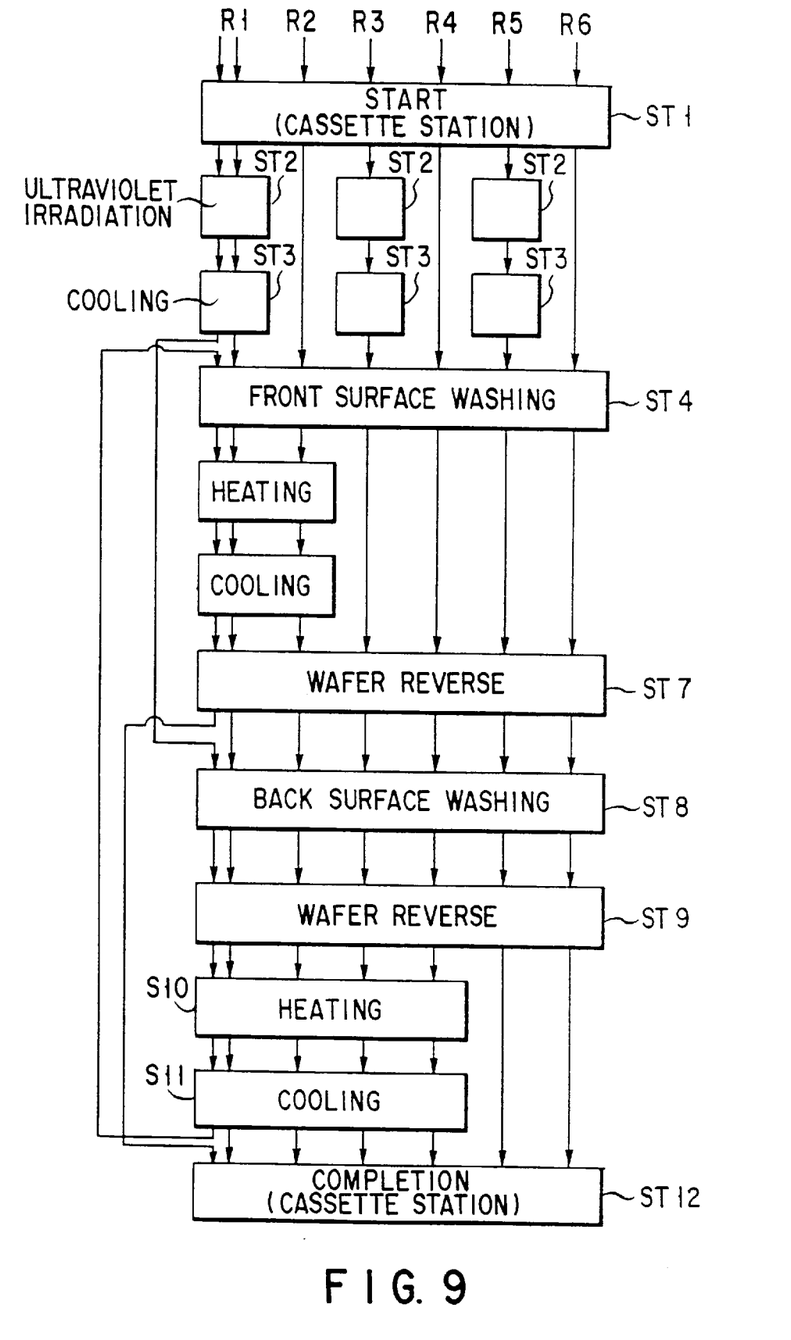
FIG. 9 is a flow chart showing a method of washing a substrate according to the present invention.

Now, each of recipes R1 to R6 will be explained with reference to FIG. 9.

Recipe R1 will be first explained. In the recipe R1, first and second wafers W are processed simultaneously. The first wafer W is taken out from the cassette C of the first cassette station 1 by the first sub-arm mechanism 11 and passed to the main arm mechanism 4 (Step ST1). The first wafer W is sequentially processed in steps ST1 to ST12 in the order mentioned, simultaneously with the second wafer W. On the other hand, the second wafer W is taken out from the cassette C of the second cassette station 3 by the sub-arm mechanism 31 and passed to the main arm mechanism 4 (Step ST1). The second wafer W is sequentially processed in the steps ST1, ST2, ST3, ST8, ST9, ST10, ST11, ST4, ST5, ST6, ST7, and ST12 in the order mentioned, simultaneously with the first wafer.

Then, the first wafer W is loaded by the main arm mechanism 4 into the heating unit 25 disposed in the uppermost stage to form a silicon oxide film on the front surface of the silicon wafer W to be processed, by a thermal oxidation method. In recipe R1, the upper (front) surface of the first wafer W is irradiated with ultraviolet rays for about three seconds in the unit 25 to improve the quality of the silicon oxide film (thermal oxidation film), to remove the organic material, and to prevent particles from being attached to the film surface (Step ST2). During the ultraviolet irradiation step ST2, the lower surface (back surface) of the first wafer W is heated simultaneously with the irradiation. The combination of the ultraviolet irradiation and heating is effective for increasing the effects of improving the quality of silicon oxide film and of improving the removal of the organic materials attached to the wafer. The first wafer W is then loaded into the cooling unit 26 to cool it to room temperature (Step ST3).

In the next step, the first wafer W is loaded by the main arm mechanism 4 in any one of front surface washing units 21. The surface of the first wafer W is then scrubbed for the washing purpose (Step ST4). In the surface washing step ST4, it is desirable to use a soft or hard sponge for forming the scrubbing member. It is also desirable to control finely the pressure applied from the sponge to the wafer W. In the washing unit 21, the wet wafer W is rotated at a high speed to centrifugally remove the liquid attached to the wafer surface.

While the front surface of the first wafer W is scrubbed in accordance with recipe R1, the back surface of the second wafer W is simultaneously scrubbed in accordance with recipe R1.

The first wafer W is loaded into any one of the heating units 25 by the main arm mechanism 4. The wafer W is heated to further dry its surface (Step ST5). Subsequently, the wafer W is loaded into the cooling unit 26 to cool it to room temperature (Step ST6). Thereafter, the wafer W is loaded into the reversion unit 27 or 28 by the main arm mechanism 4 to reverse the wafer W upside down (Step ST7).

In the next step, the wafer W is loaded into any one of the back surface washing units 23 by the main arm mechanism 4 to scrub the back surface of the wafer W (Step ST8). In this back surface washing step ST8, it is desired to use a brush formed by bundling synthetic resin fibers. A wet wafer W is rotated at a high speed in the washing unit 23 to centrifugally remove the liquid attached to the wafer surface. Thereafter, the wafer W is loaded by the main arm mechanism 4 into the reversion unit 27 or 28 to reverse the wafer W upside down (Step ST8).

The wafer W is then loaded into any one of the heating units 25 by the main arm mechanism 4 to heat the wafer W to further dry its surface (Step ST10). Subsequently, the wafer W is loaded into the cooling unit 26 to cool the wafer W to room temperature (Step ST11). The wafer W processed is returned to cassette C in the cassette station 1. In this way, a series of processes is completed (Step ST12).

In the process of recipe R1, organic materials can be removed from the wafer surface in the ultraviolet ray irradiation step ST2 to clean the wafer surface. Since the wafer W is heated to dry in the heat and dry step ST5 after the step of washing the front surface of the wafer, and also heated to dry in the heat and dry step ST10 after the back surface washing, the front and back surfaces of the wafer can be completely dried without fail.

Now, recipes R2 to R6 will be explained.

Recipe R2 is substantially the same as recipe R1 described above, except that the ultraviolet ray irradiation step ST2 and cooling step ST3 are excluded from recipe R1. Recipe R2 is selected in the case where it is unnecessary to remove the organic materials.

Recipe R3 is substantially the same as recipe R1 except that the heat/dry step ST5 and the cooling step ST6 are excluded from recipe R1. Recipe R3 is selected in the case where the heat/dry step ST10 alone is sufficient to satisfy the drying conditions after the step of drying the back surface.

Recipe R4 is substantially the same as recipe R3 except that the ultraviolet ray irradiation step ST2 and the cooling step ST3 are excluded from recipe R3. Recipe R4 is selected in the case where the heat/dry step ST10 alone is sufficient to satisfy the dry conditions after the step of drying the back surface and it is not necessary to remove the organic materials.

Recipe R5 is substantially the same as recipe R3 except that the heat/dry step ST10 and the cooling step ST11 after the step of washing the back surface are excluded from recipe R3. Recipe R5 is selected in the case where drying conditions are satisfied only by centrifugally removing the liquid attached to the wafer W by spin-rotation.

Recipe R6 is substantially the same as recipe R5 except that the ultraviolet irradiation step ST2 and the cooling step ST3 are excluded from recipe R5. Recipe R6 is selected in the case where drying conditions are satisfied by the hear/dry step ST10 after the step of drying the back surface and it is not necessary to remove organic materials.

These operations are controlled by CPU 90 on the basis of the recipe selected by a recipe controller 92 and other control information. The recipe controller 92 is further controlled under the conditions set by the operation section 91.

As described in the foregoing, since cassette stations 1 and 3 are provided, the first wafer W is loaded from the first cassette station 1 to wash the front surface first. On the other hand, the second wafer W is loaded from the cassette station 3 to wash the back surface first. The operation control mentioned makes it possible to efficiently wash a plurality of wafers W loaded from the two cassette stations 1 and 3, thereby obtaining an extremely high throughput.

Furthermore, since two cassette stations 1 and 3 are used, individual wafers can be washed in different procedures. To explain more specifically, it is possible to wash only the front surface of the wafer W loaded from the cassette station 1, in the surface washing unit 21 and to wash only back surface of the wafer W from the cassette 3, in the back surface washing unit 23. In this way, wafers W loaded from both cassette stations present in different processing orders are washed simultaneously. The washing is performed highly flexibly.

The present invention is not limited to the aforementioned embodiments and can be modified in various ways.

For example, in the aforementioned embodiment, in the case where the wafer is loaded from the cassette station 1, the front surface is washed first. In the case where the wafer is loaded from the cassette station 3, its back surface is washed first. A reversal case is acceptable. A substrate to be washed is not limited to a semiconductor wafer. It is possible to use an LCD substrate, a glass substrate, a CD substrate, a photomask, a print substrate, and the like. The present invention is applied to a washing process and may be applied to other processes.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. An apparatus for washing both surfaces of a substrate comprising:

a process section having
a first washing unit for scrubbing a front surface of a substrate for a washing purpose by bringing a scrub member into contact with the front surface of the substrate while pouring a liquid to the front surface, and
a second washing unit for scrubbing a back surface of a substrate for a washing purpose by bringing a scrub member into contact with the back surface of the substrate while pouring a liquid to the back surface;

a main arm mechanism for loading/unloading a substrate into/from at least the first and second washing units included in the process section;

a first cassette section provided on one of sides of the process section for loading/unloading a plurality of cassettes housing substrates;

a second cassette section provided on the other side of the process section and facing the first cassette section with the process section interposed therebetween;

a first sub-arm mechanism for loading/unloading a substrate into/from a cassette in the first cassette section to pass the substrate to the main arm mechanism;

a second sub-arm mechanism for loading/unloading a substrate into/from a cassette in the second cassette section to pass the substrate to the main arm mechanism;

controllers for controlling the main arm mechanism and the process section, separately, such that a first substrate taken out from the first cassette is subjected to the first washing unit to scrub its front surface, first, and then subjected to the second washing unit to scrub its back surface; while a second substrate taken out from the second cassette is subjected to the second washing unit to scrub its back surface first and then subjected to the first washing unit to scrub its front surface.

2. An apparatus for washing both surfaces of a substrate comprising:

a process section having
   a first washing unit for scrubbing a front surface of a substrate for a washing purpose by bringing a scrub member into contact with the front surface of the substrate while pouring a liquid to the front surface, and
   a second washing unit for scrubbing a back surface of a substrate for a washing purpose by bringing a scrub member into contact with the back surface of the substrate while pouring a liquid to the back surface;
a main arm mechanism for loading/unloading a substrate into/from at least the first and second washing units included in the process section;
a first cassette section provided on one of sides of the process section for loading/unloading a plurality of cassettes housing substrates;
a second cassette section provided on the other side of the process section and facing the first cassette section with the process section interposed therebetween;
a first sub-arm mechanism for loading/unloading a substrate into/from a cassette in the first cassette section to pass the substrate to the main arm mechanism;
a second sub-arm mechanism for loading/unloading a substrate into/from a cassette in the second cassette section to pass the substrate to the main arm mechanism;
controllers for controlling the first and second sub-arm mechanisms, the main arm mechanism, and the process section, separately, such that substrates are loaded into the process section successively from cassettes of the first and second cassette sections by means of first and second sub-arm mechanisms, and the substrates loaded in the process section are subjected to a scrub washing process by the main arm mechanism to wash simultaneously using different cleaning processes.

3. The apparatus according to claim 1 or 2, wherein
said first cassette section has a substantially linear first sub-passageway for moving the first sub-arm mechanism thereon;
said second cassette section has a substantially linear second sub-passageway for moving the second sub-arm mechanism thereon; and
said process section has a substantially linear main passageway for moving the main arm mechanism thereon;
the first and the second sub-passageways crossing terminal end portions of the main passageway at right angles.

4. The apparatus according to claim 1 or 2, wherein
said first cassette section has a substantially linear first sub-passageway for moving the first sub-arm mechanism thereon;
said second cassette section has a substantially linear second sub-passageway for moving the second sub-arm mechanism; and
said process section has a substantially linear main passageway for moving the main arm mechanism thereon;
the first and second sub-passageways and the main passageway are connected to form an H-shape configuration in a horizontal plane.

5. The apparatus according to claim 2, wherein the process section further comprises a heating unit for heating the substrate to dryness and a cooling unit for cooling the substrate heated.

6. The apparatus according to claim 2, wherein
said process section has substrate reversing means for reversing the substrate to exchange a front surface with a back surface; and
said controllers control the substrate reversing means, the main arm mechanism, and the process section such that the substrate is reversed by the substrate reversing means after either a front surface or a back surface is scrubbed in either said first or said second washing units.

7. A method of washing both surfaces of a substrate, comprising the steps of:
(a) preparing
   a process section having
      a first washing unit for scrubbing a front surface of a substrate for a washing purpose by bringing a scrub member into contact with the front surface of the substrate while pouring a liquid to the front surface, and
      a second washing unit for scrubbing a back surface of a substrate for a washing purpose by bringing a scrub member into contact with the back surface of the substrate while pouring a liquid to the back surface;
   a main arm mechanism for loading/unloading a substrate into/from at least the first and second washing units included in the process section;
   a first cassette section provided on one of sides of the process section for loading/unloading a plurality of cassettes housing substrates;
   a second cassette section provided on the other side of the process section and facing the first cassette section with the process section interposed therebetween;
   a first sub-arm mechanism for loading/unloading a substrate into/from a cassette in the first cassette section to pass the substrate to the main arm mechanism;
   a second sub-arm mechanism for loading/unloading a substrate into/from a cassette in the second cassette section to pass the substrate to the main arm mechanism;
   controllers for controlling the main arm mechanism and the process section, separately, such that a first substrate taken out from the first cassette is subjected to the first washing unit to scrub its front surface, first, and then subjected to the second washing unit to scrub its back surface; while a second substrate taken out from the second cassette is subjected to the second washing unit to scrub its back surface first and then subjected to the first washing unit to scrub its front surface;
(b) scrubbing a front surface of a first substrate taken out from the first cassette in the first washing unit, and then, subjecting the first substrate to the second washing unit to scrub its back surface; and
(c) scrubbing a back surface of a second substrate taken out form the second cassette in the second washing unit, and then, subjecting the second substrate to the first washing unit to scrub its front surface.

8. The method according to claim 7, further comprising
the step of heating the first substrate to dryness after the step (b), and
the step of heating the second substrate to dryness after the step (c).

9. The method according to claim 7, wherein, in the step (b), after the front surface of the first substrate is scrubbed, the first substrate is reversed to scrub the back surface of the first substrate, and
in the step (c), after the back surface of the second substrate is scrubbed, the second substrate is reversed to scrub the front surface of the second substrate.

10. The method according to claim 7, wherein the front surface of said first or said second substrate is covered with a thermal oxidation film formed by a thermal oxidation method.

11. The method according to claim 8, wherein the first or the second substrate is heated simultaneously and the front surface of the first or the second substrate is irradiated with ultraviolet rays.

12. A method of washing both surfaces of a substrate, comprising the steps of:

(A) preparing a process section having a first washing unit for scrubbing a front surface of a substrate for a washing purpose by bringing a scrub member into contact with the front surface of the substrate while pouring a liquid to the front surface; and a second washing unit for scrubbing a back surface of a substrate for a washing purpose by bringing a scrub member into contact with the back surface of the substrate while pouring a liquid to the back surface;

a main arm mechanism for loading/unloading a substrate into/from at least the first and second washing units included in the process section;

a first cassette section provided on one of sides of the process section for loading/unloading a plurality of cassettes housing, substrates;

a second cassette section provided on the other side of the process section and facing the first cassette section with the process section interposed therebetween;

a first sub-arm mechanism for loading/unloading a substrate into/from a cassette in the first cassette section to pass the substrate to the main arm mechanism;

a second sub-arm mechanism for loading/unloading a substrate into/from a cassette in the second cassette section to pass the substrate to the main arm mechanism;

controllers for controlling the first and second sub-arm mechanisms, the main arm mechanism, and the process section, separately.

(B) loading substrates successively by said first and said second sub-arm mechanisms from cassettes of the first and the second cassette sections into the process section successively; and (C) scrubbing the substrates loaded into the process section for a washing purpose by using the main arm mechanism, simultaneously using different cleaning processes.

13. The method according to claim 12, wherein, in the step (C), after front and back surfaces of a substrate are scrubbed, the substrate is heated to dryness and then cooled.

14. The method according to claim 12, wherein, in the step (C), after either a front surface or a back surface of a substrate is scrubbed, the substrate is reversed to scrub either the back surface or the front surface of the substrate.

15. The method according to claim 12, wherein a front surface of the substrate is covered with a thermal oxidation film formed by a thermal oxidation method.

16. The method according to claim 13, wherein the substrate is heated simultaneously and a front surface of the substrate is irradiated with ultraviolet rays.

* * * * *